United States Patent
Yoshikawa et al.

(10) Patent No.: US 6,717,794 B2
(45) Date of Patent: Apr. 6, 2004

(54) COMPOSITE MULTILAYERED CERAMIC BOARD AND MANUFACTURING METHOD THEREOF

(75) Inventors: Hideki Yoshikawa, Takarazuka (JP); Seiichirou Takahashi, Nara (JP)

(73) Assignee: Sanyo Electric Co., Ltd., Moriguchi (JP)

(*) Notice: Subject to any disclaimer, the term of this patent is extended or adjusted under 35 U.S.C. 154(b) by 18 days.

(21) Appl. No.: 10/029,223

(22) Filed: Dec. 28, 2001

(65) Prior Publication Data
US 2002/0114932 A1 Aug. 22, 2002

(30) Foreign Application Priority Data
Dec. 28, 2000 (JP) ........................................ 2000-400874

(51) Int. Cl.[7] .................................................. H01K 1/14
(52) U.S. Cl. ..................... 361/321.2; 361/738; 361/746; 428/692
(58) Field of Search .................. 428/210, 692; 361/321.1, 321.2, 323, 736, 738, 748, 746; 335/196, 199

(56) References Cited

U.S. PATENT DOCUMENTS

| | | | | |
|---|---|---|---|---|
| 5,384,434 A | * | 1/1995 | Mandai et al. ............... | 174/258 |
| 5,476,728 A | * | 12/1995 | Nakano et al. .............. | 428/692 |
| 6,115,264 A | * | 9/2000 | Nosaka ........................ | 361/821 |
| 6,337,123 B1 | * | 1/2002 | Ryugo et al. ................ | 428/210 |
| 6,426,551 B1 | * | 7/2002 | Kawakami et al. ......... | 257/700 |
| 6,534,842 B2 | * | 3/2003 | Ibata et al. .................. | 257/531 |

FOREIGN PATENT DOCUMENTS

| | | | |
|---|---|---|---|
| JP | 05144651 | * | 6/1993 |
| JP | 7-161583 | | 6/1995 |
| JP | 2518757 | | 5/1996 |
| JP | 8-274464 | | 10/1996 |
| JP | 9-35938 | | 2/1997 |

* cited by examiner

*Primary Examiner*—Cathy Lam
(74) *Attorney, Agent, or Firm*—Westerman, Hattori, Daniels & Adrian, LLP

(57) ABSTRACT

A composite multilayered ceramic board includes a multilayered ceramic board made of dielectric ceramics, a multilayered ceramic board made of magnetic ceramics and an adhesive layer made of thermosetting resin such as polyimide and the like. In this composite multilayered ceramic board, the dielectric multilayered ceramic board and the magnetic multilayered ceramic board are joined through the adhesive layer.

7 Claims, 10 Drawing Sheets

F I G. 3
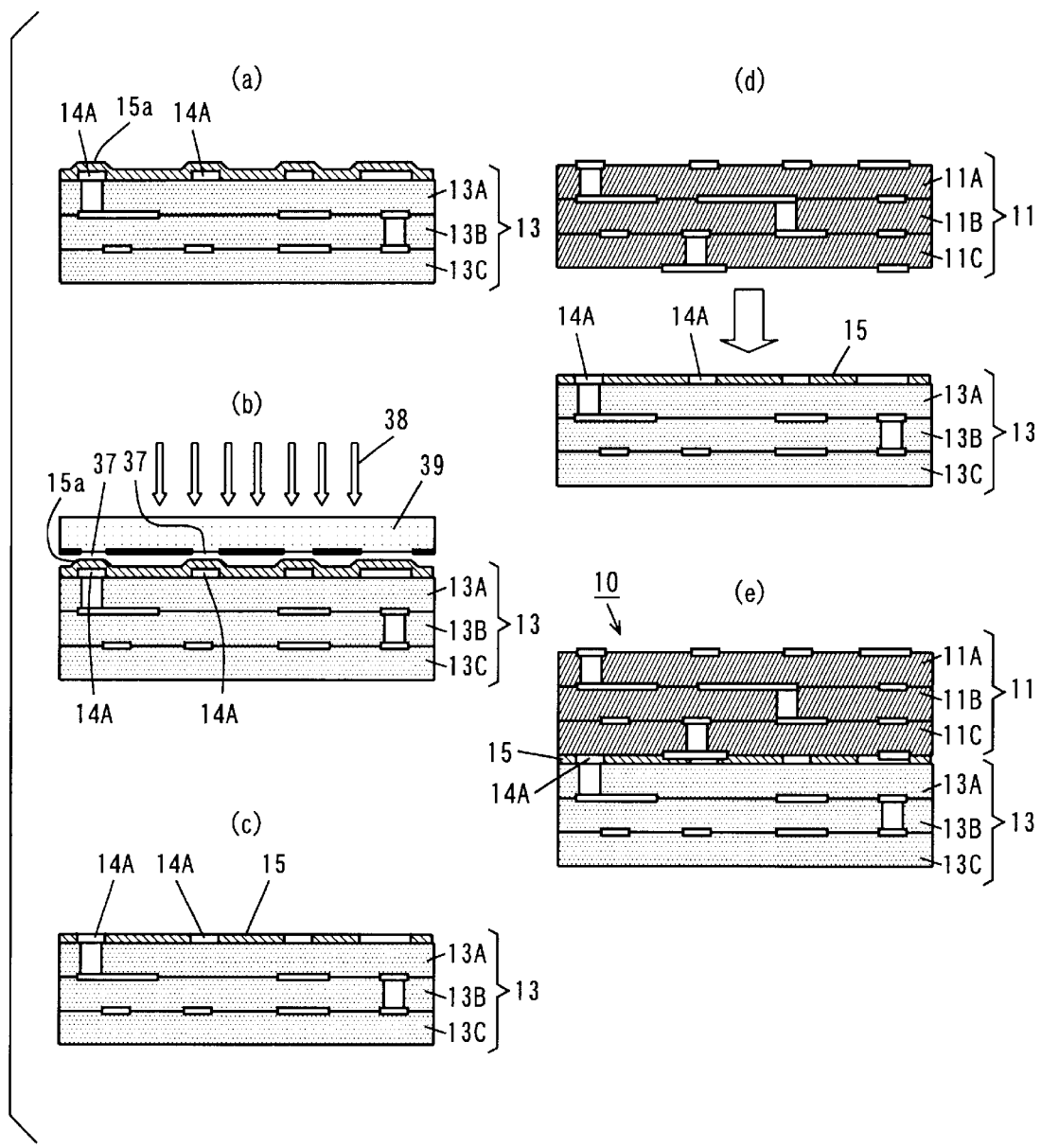

F I G. 4
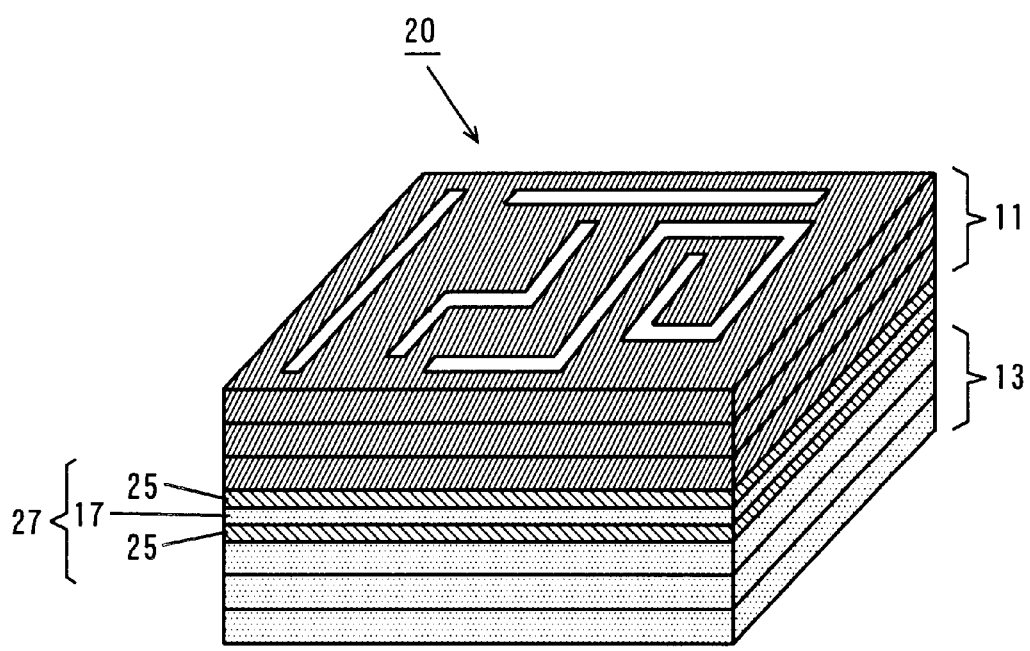

F I G. 5
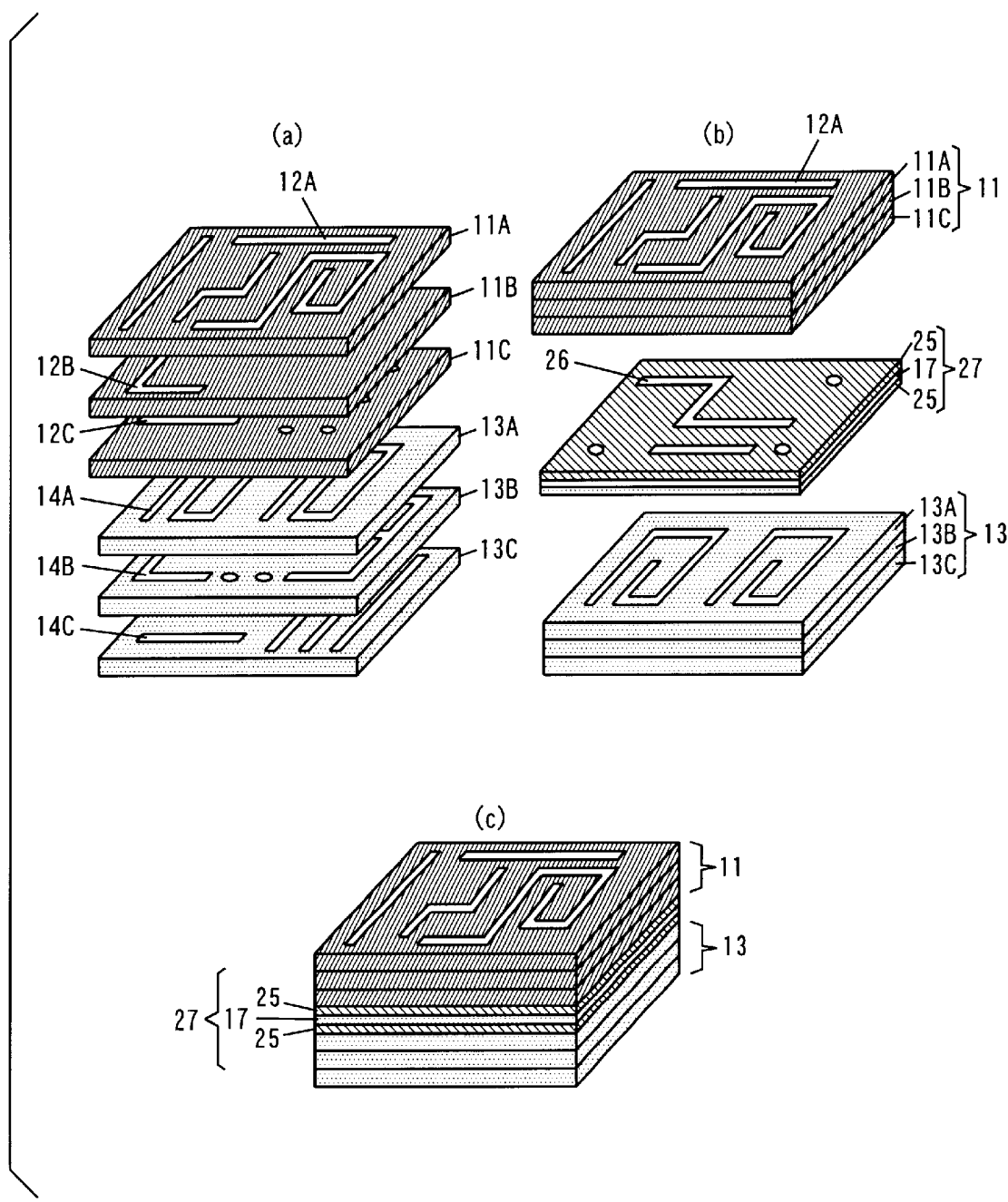

COMPOSITE MULTILAYERED CERAMIC BOARD AND MANUFACTURING METHOD THEREOF

BACKGROUND OF THE INVENTION

1. Field of the Invention

The present invention relates to a composite multilayered ceramic board in which plural kinds of multilayered ceramic boards are laminated, and to a method of manufacturing the same.

2. Description of the Background Art

As for mobile communication devices such as mobile telephones and portable communication terminals, smaller-sized devices have been highly required. Thus, smaller size and higher performance have also been required for high-frequency circuit boards used as internal components of such devices.

In order to satisfy such requirements, a multilayered ceramic board is employed for the high-frequency circuit board. The multilayered ceramic board has such construction that wiring patterns are formed on green sheets serving as the base of the ceramic board to form capacitance or inductance components thereon, without employing the technique that capacitors or inductors being components for use in surface mount are mounted on a printed circuit board. Since the multilayered ceramic board requires a smaller number of surface mount parts, the smaller-sized high-frequency circuit board is achieved.

The multilayered ceramic board is manufactured by forming wiring patterns on a plurality of green sheets mainly composed of alumina ($Al_2O_3$), laminating those green sheets, and sintering the whole of the laminated sheets at a temperature of from 800° C. to 1600° C. to integrate the sintered sheets as one.

FIGS. 7(a) and 7(b) are schematic perspective views showing a method of manufacturing a conventional multilayered ceramic board.

As shown in FIG. 7(a), first of all, predetermined wiring patterns 32A to 32D are formed, respectively, on green sheets 31A to 31D composed of alumina by screen printing. Then, as shown in FIG. 7(b), the green sheets 31A to 31D are laminated and sintered together at a temperature of from 800° C. to 1600° C. to form a multilayered ceramic board 30. Here, the green sheets are such sheets as made by mixing and kneading organic binders, ceramic raw material powders and the like, then processing the resultant mixture in the form of sheets and drying the processed sheets.

In the multilayered ceramic board 30, it is made possible to obtain capacitance or inductance in the internal portion of the multilayered ceramic board by forming the predetermined wiring patterns 32A to 32D on the green sheets 31A to 31D composed of alumina by screen printing. This makes it possible to reduce the number of capacitors or inductors being the surface mount components, enabling a decrease in the size of the components of the high-frequency circuit. Further, since the multilayered ceramic board 30 is formed of alumina exhibiting an insulation property as a main constituent, the board is suitable for forming resistance therein.

In the case where a multilayered ceramic board made of alumina with a smaller dielectric constant is substituted for a capacitor, the value of capacitance incorporated in the multilayered ceramic board is limited. Thus, if the value of capacitance is required to be obtained in a wide range, a capacitor being a component for use in surface mount is required. Alternatively, in the case where a multilayered ceramic board made of alumina without magnetism is substituted for an inductor, the value of inductance incorporated in the multilayered ceramic board is limited. Thus, if the value of inductance is required to be obtained in a wide range, an inductor or a transformer being a component for use in surface mount is required.

For example, if the value of capacitance and the value of inductance are required in a wide range, the number of components for use in surface mount can further be reduced by using a combination of a multilayered ceramic board composed of dielectric ceramics (hereinafter abbreviated as a dielectric multilayered ceramic board) and a multilayered ceramic board composed of magnetic ceramics (hereinafter abbreviated as a magnetic multilayered ceramic board) rather than using a multilayered ceramic board composed of an insulating ceramics (hereinafter abbreviated as an insulating multilayered ceramic board). A description will now be made on a method of combining the dielectric multilayered ceramic board and the magnetic multilayered ceramic board.

FIGS. 8(a) and 8(b) are schematic perspective views showing a manufacturing method of combining the dielectric multilayered ceramic board and the magnetic multilayered ceramic board.

With reference to FIG. 8(a), wiring patterns 42A to 42C are first formed on green sheets 41A to 41C made of dielectric ceramics by screen printing. Those green sheets are composed of, e.g., barium titanate (with a dielectric constant of 1400) (hereinafter abbreviated as dielectric green sheets). Wiring patterns 44A to 44C are formed on green sheets 43A to 43C composed of magnetic ceramics by screen printing. Those green sheets are composed of, e.g., a NiZn ferrite (with an initial magnetic permeability>70, a magnetic flux density>0.2T) (hereinafter abbreviated as magnetic green sheets).

Then, with reference to FIG. 8(b), the dielectric green sheets 41A to 41C and the magnetic green sheets 43A to 43C are laminated integrally, sintered together at a temperature of from 800° C. to 1600° C., so as to form a composite multilayered ceramic board 40.

In the composite multilayered ceramic board 40, the wiring patterns 42A to 42C formed on the green sheets 41A to 41C made of dielectric ceramics constitute a circuit mainly including a capacitance component. The wiring patterns 44A to 44C formed on the green sheets 43A to 43C made of magnetic ceramics constitute a circuit mainly including an inductance component. This makes it possible to obtain the value of capacitance and the value of inductance in a wide range. This enables a decrease in the number of capacitors and inductors being the components for use in surface mount and enables a decrease in the size of the components for use in the high-frequency circuit.

In the method of forming the composite multilayered ceramic board 40 by integrally laminating the dielectric green sheets 41A to 41C and the magnetic green sheets 43A to 43C and sintering the laminated sheets in whole, however, an internal stress densification phenomenon occurs which causes shrinkage of the materials for use in the multilayered ceramic boards, in a process that powders of the materials for use in the plurality of multilayered ceramic boards made of different materials are sintered in whole and grow to crystal grains. The shrinkage of the materials vary depending on the type, the thickness and the materials of the green sheets, and the mixing ratio of binders, the particle size and the shape of the material powders or the sintering conditions and the like.

FIG. 9 is a schematic cross-sectional view of the composite multilayered ceramic board 40 showing the sintering state of the board 40 having different shrinkage percentages. With reference to FIG. 9, the composite multilayered ceramic board 40 is formed of a dielectric multilayered ceramic board 41 and a magnetic multilayered ceramic board 43. Since this composite multilayered ceramic board 40 is formed by integrally laminating the dielectric multilayered ceramic board 41 and the magnetic multilayered ceramic board 43 which have different shrinkage percentages and then sintering the laminated boards in whole, deflection R is produced due to the shrinkage of materials.

FIG. 10 is an enlarged view of a joint portion of the dielectric multilayered ceramic board 41 and the magnetic multilayered ceramic board 43 shown in FIG. 9. With reference to FIG. 10(a), if no deflection R is caused by the shrinkage of materials, ideally, for example, no deviation is produced between a wiring pattern 42C formed on a dielectric multilayered ceramic board 41C and a via hole 44A formed on a magnetic multilayered ceramic board 43A. However, as shown in FIG. 10(b), if deflection R is caused by the shrinkage of materials, deviation σ of wiring occurs between the wiring pattern 42C formed on the dielectric multilayered ceramic board 41C and the via hole 44A formed on the magnetic multilayered ceramic board 43A. The wiring deviation a causes an increase in electric resistance in the composite multilayered ceramic board 40, resulting in deterioration in circuit characteristics.

Thus, a description will now be made on a method of preventing the production of the wiring deviation. FIGS. 11(a) and 11(b) are schematic perspective views showing a manufacturing method of preventing the production of the wiring deviation σ in a composite multilayered ceramic board.

With reference to FIG. 11(a), wiring patterns 42A to 42C are formed, respectively, on green sheets 41A to 41C made of dielectric ceramics by screen printing. Wiring patterns 44A to 44C are formed, respectively, on green sheets 43A to 43C made of magnetic ceramics by screen printing. Each one of the green sheets made of dielectric ceramics and each one of those made of magnetic ceramics are sintered one by one to form individual ceramic boards 45a to 45c and 48a to 48c.

Those individual ceramic boards 45a to 45c and 48a to 48c are then cooled off. After the cooling, adhesives made of thermosetting resin such as polyimide and the like (hereinafter referred to adhesive layers) 46B, 46C, 47A to 47C are each applied on the respective upper faces of the individual ceramic boards 45b, 45c, 48a to 48c. Then, a part of the adhesive layers is removed so that the wiring patterns 42B, 42C, 44A to 44C formed on the individual ceramic boards 45b, 45c, 48a to 48c are electrically connected with each other.

Finally, the adhesive layers 46B, 46C, 47A to 47C are interposed between the individual ceramic boards 45a to 45c, 48a to 48c, respectively, and then the boards are laminated and joined with each other at a temperature of approximately 200° C., so as to form a composite multilayered ceramic board 50.

Since the composite multilayered ceramic board 50 is constituted by joining the individual ceramic boards 45a to 45c, 48a to 48c one by one using the adhesive layers 46B, 46C and 47A to 47C, this makes it possible to inhibit the production of deviations between the layers of the composite multilayered ceramic board and prevent the wiring deviations σ. However, such a method of manufacturing the composite multilayered ceramic board results in a deterioration in the strength of the formed composite multilayered ceramic board in comparison with the case where the plurality of green sheets serving as the base of the ceramic board are laminated integrally and sintered in whole.

SUMMARY OF THE INVENTION

An object of the present invention is to provide a composite multilayered ceramic board having its deflection prevented and its strength increased and a method of manufacturing such a composite multilayered ceramic board.

A composite multilayered ceramic board according to one aspect of the present invention includes a first multilayered ceramic board formed by integrally sintering a plurality of green sheets that have a predetermined wiring pattern and are made of a first material, a second multilayered ceramic board formed by integrally sintering a plurality of green sheets that have a predetermined wiring pattern and are made of a second material that is different from the first material, and an adhesive layer formed between the first multilayered ceramic board and the second multilayered ceramic board.

In the composite multilayered ceramic board, since the first multilayered ceramic board is formed by integrally sintering a plurality of green sheets that have a predetermined wiring pattern and are made of the first material, this board has no deflection and the green sheets are firmly joined together, in comparison with a multilayered ceramic board formed by integrally sintering a plurality of green sheets that are made of different materials. Further, since the second multilayered ceramic board is formed by integrally sintering a plurality of green sheets that have a predetermined wiring pattern and are made of the second material that is different from the first material, this board has no deflection and the green sheets are firmly joined together, in comparison with the multilayered ceramic board formed by integrally sintering a plurality of green sheets made of different materials. In addition, since the adhesive layer is provided between the first and second multilayered ceramic boards, the production of deflection is prevented, leading to a decrease in electrical resistance caused by deviation of wiring patterns and to improved electrical circuit characteristics. This makes it possible to obtain such a composite multilayered ceramic board that has its deflection prevented and its strength increased.

One face of the first multilayered ceramic board may be joined to one face of the adhesive layer, and one face of the second multilayered ceramic board may be joined to the other face of the adhesive layer.

In that case, the first multilayered ceramic board and the second multilayered ceramic board are directly joined together by the adhesive layer.

The composite multilayered ceramic board further includes a wiring board, the adhesive layer includes a first adhesive layer and a second adhesive layer, and the wiring board is interposed between the first and second adhesive layers. In that case, one face of the first multilayered ceramic board may be joined to one face of the first adhesive layer. One face of the wiring board may be joined to the other face of the first adhesive layer. One face of the second multilayered ceramic board may be joined to one face of the second adhesive layer. The other face of the wiring board may be joined to the other face of the second adhesive layer.

In that case, the first and second multilayered ceramic boards are joined by the adhesive layer, with the wiring board interposed between those boards.

A partial region of the adhesive layer may be removed for the electrical connection between the wiring pattern of the first multilayered ceramic board and that of the second multilayered ceramic board.

In that case, the respective wiring patterns of the first and second multilayered ceramic boards are electrically connected to each other through the removed region of the adhesive layer.

The first material may include one of a dielectric material, a magnetic material and an insulating material, while the second material may include one of the dielectric material, magnetic material and insulating material.

In that case, a large capacitance component, a large inductance component or a large resistance component can be formed in the first or second multilayered ceramic board. This makes it possible to reduce the number of capacitors, inductors or resistors being components for use in surface mount, resulting in a smaller-sized composite multilayered ceramic board.

The first material may be a dielectric material, while the second material may be a magnetic material. In that case, multilayered ceramic board, while a large inductance component can be formed in the second multilayered ceramic board. This makes it possible to reduce the number of capacitors and inductors being components for use in surface mount, resulting in a smaller-sized composite multilayered ceramic board.

The first material may be a dielectric material, and the second material may be an insulating material. In that case, a large capacitance component can be formed in the first multilayered ceramic board, while a large resistance component can be formed in the second multilayered ceramic board. This makes it possible to reduce the number of capacitors and resistors being components for use in surface mount, resulting in a smaller-sized composite multilayered ceramic board.

The first material may be a magnetic material, and the second material may be an insulating material. In that case, a large inductance component can be formed in the first multilayered ceramic board, while a large resistance component can be formed in the second multilayered ceramic board. This makes it possible to reduce the number of inductors and resistors being the components for use in surface mount, leading to a smaller-sized composite multilayered ceramic board.

The adhesive layer may include a thermosetting resin. In that case, since the adhesive layer includes the thermosetting resin, heating facilitates its adhesion and setting, thereby enabling the formation of a composite multilayered ceramic board with excellent heat resisting properties.

A method of manufacturing a composite multilayered ceramic board according to one aspect of the present invention includes the steps of: laminating a plurality of green sheets that have a predetermined wiring pattern and are made of a first material and then sintering the laminated sheets so as to integrally form a first multilayered ceramic board, laminating a plurality of green sheets that have a predetermined wiring pattern and are made of a second material being different from the first material and then sintering the laminated sheets so as to integrally form a second multilayered ceramic board, and joining the first and second multilayered ceramic boards through an adhesive layer.

In accordance with the method of manufacturing the composite multilayered ceramic board, since the first multilayered ceramic board is formed by integrally sintering a plurality of green sheets that have a predetermined wiring pattern and are made of the first material, the board has no deflection and the green sheets are firmly joined together, in comparison with the multilayered ceramic board formed by integrally sintering a plurality of green sheets made of different materials. Since the second multilayered ceramic board is formed by integrally sintering a plurality of green sheets that have a predetermined wiring pattern and are made of the second material which is different from the first material, the board has no deflection and the sheets are firmly joined together, in comparison with the multilayered ceramic board formed by integrally sintering a plurality of green sheets made of different materials. Moreover, since the first and second multilayered ceramic boards are joined through the adhesive layer, the production of deflection is inhibited, thereby decreasing electrical resistance caused by the deviation of wiring patterns, resulting in improved electrical circuit characteristics. This makes it possible to obtain such a composite multilayered ceramic board that has its deflection prevented and its strength increased.

The step of joining the boards through the adhesive layer may include the step of joining one face of the first multilayered ceramic board to one face of the adhesive layer and joining one face of the second multilayered ceramic board to the other face of the adhesive layer.

In that case, the first and second multilayered ceramic boards are directly joined by the adhesive layer.

In case where the adhesive layer includes a first adhesive layer and a second adhesive layer, the step of joining the boards through the adhesive layer may include the steps of placing a wiring board between the first and second adhesive layers, joining one face of the first multilayered ceramic board and one face of the first adhesive layer, joining one face of the wiring board and the other face of the first adhesive layer, joining one face of the second multilayered ceramic board and one face of the second adhesive layer, and joining the other face of the wiring board and the other face of the second adhesive layer.

In that case, the first and second multilayered ceramic boards are joined by the adhesive layer with the wiring board interposed between those boards.

The method of manufacturing the composite multilayered ceramic board may further include the step of removing a partial region of the adhesive layer for the electrical connection between the respective wiring patterns of the first and second multilayered ceramic boards.

In that case, the respective wiring patterns of the first and second multilayered ceramic boards are electrically connected to each other through the removed region of the adhesive layer.

The first material is one of a dielectric material, a magnetic material and an insulating material, and the second material is one of the dielectric material, magnetic material and insulating material.

In that case, a large capacitance component, a large inductance component or a large resistance component can be formed in the first multilayered ceramic board or the second multilayered ceramic board, and the number of capacitors, inductors or resistors being components for use in surface mount can be reduced, resulting in a smaller-sized composite multilayered ceramic board.

The first material may be the dielectric material, while the second material may be the magnetic material. In that case, a large capacitance component can be formed in the first multilayered ceramic board, while a large inductance component can be formed in the second multilayered ceramic board. This makes it possible to reduce the number of capacitors and inductors being components for use in surface mount, leading to a smaller-sized composite multilayered ceramic board.

The first material may be the dielectric material, while the second material may be the insulating material. In that case, a large capacitance component can be formed in the first multilayered ceramic board, while a large resistance component can be formed in the second multilayered ceramic board. This makes it possible to reduce the number of capacitors or resistors being components for use in surface mount, enabling a smaller-sized composite multilayered ceramic board.

The first material may be the magnetic material, while the second material may be the insulating material. In that case, a large inductance component can be formed in the first multilayered ceramic board, while a large resistance component can be formed in the second multilayered ceramic board. This makes it possible to reduce the number of inductors and resistors being components for use in surface mount, resulting in a smaller-sized composite multilayered ceramic board.

The step of removing the partial region of the adhesive layer may include a photolithography step. In that case, since a portion of the adhesive layer is removed by the step of photolithography, the removal of the portion of the adhesive layer can be made in high accuracy.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a schematic perspective view showing a detailed method of forming an adhesive layer of the composite multilayered ceramic board shown in FIG. 2;

FIG. 4 is a schematic perspective view showing a composite multilayered ceramic board in a second embodiment of the present invention;

FIG. 5 is a schematic perspective view showing a method of manufacturing the composite multilayered ceramic board in the second embodiment of the present invention;

DESCRIPTION OF THE PREFERRED EMBODIMENTS

Figure 1:
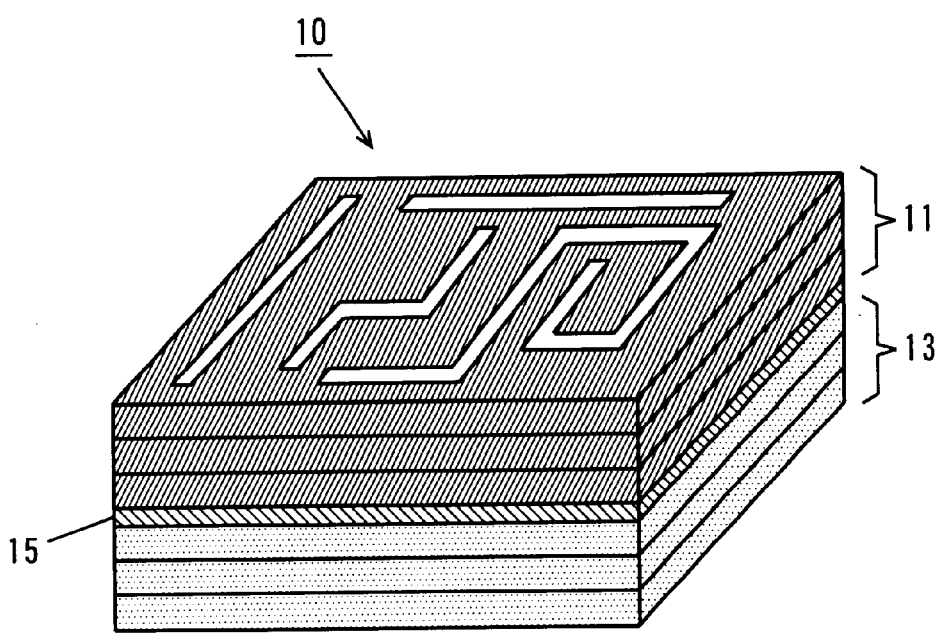
FIG. 1 is a schematic perspective view showing a composite multilayered ceramic board in a first embodiment of the present invention.

A description will now be made on a composite multilayered ceramic board in conjunction with the present invention and a method of manufacturing such a composite multilayered ceramic board with reference to the drawings. FIG. 1 is a schematic perspective view showing a composite multilayered ceramic board in a first embodiment of the present invention.

A composite multilayered ceramic board 10 includes a multilayered ceramic board 11 made of dielectric ceramics (hereinafter referred to as a dielectric multilayered ceramic board), a multilayered ceramic board 13 made of magnetic ceramics (hereinafter referred to as a magnetic multilayered ceramic board), and an adhesive layer 15 made of thermosetting resin such as polyimide and the like. In this composite multilayered ceramic board 13, the dielectric multilayered ceramic board 11 and the magnetic multilayered ceramic board 13 are joined through the adhesive layer 15.

The dielectric multilayered ceramic board is composed of a plurality of laminated and sintered green sheets made of dielectric ceramics, and the magnetic multilayered ceramic board is composed of a plurality of laminated and sintered green sheets made of magnetic ceramics.

Those green sheets are made by mixing and kneading organic binders, ceramic raw material powders and the like, then processing the resultant mixture in the form of sheets and drying the processed sheets. The mixed and kneaded state of such materials is called a slurry in which 50 to 70 parts of a solvent, 8 to 10 parts of a binder, 0.5 to 1.0 parts of a dispersing agent and 3 to 5 parts of a plasticizer are compounded per, e.g., 100 parts of raw material powders.

While the description is made on the case where the composite multilayered ceramic board 10 includes the dielectric multilayered ceramic board 11 and the magnetic multilayered ceramic board 13 in the first embodiment of the present invention, the boards for use are not limited to the above mentioned boards. A multilayered ceramic board made of insulating ceramics (hereinafter referred to as an insulating multilayered ceramic board) may substitute for the dielectric multilayered ceramic board 11 or the magnetic multilayered ceramic board 13. That is to say, the composite multilayered ceramic board 10 may include the dielectric multilayered ceramic board 11 and the insulating multilayered ceramic board. Alternatively, the composite multilayered ceramic board 10 may include the magnetic multilayered ceramic board 13 and the insulating multilayered ceramic board. Here, the insulating multilayered ceramic board is composed of a plurality of laminated and sintered green sheets made of insulating ceramics.

Figure 2:
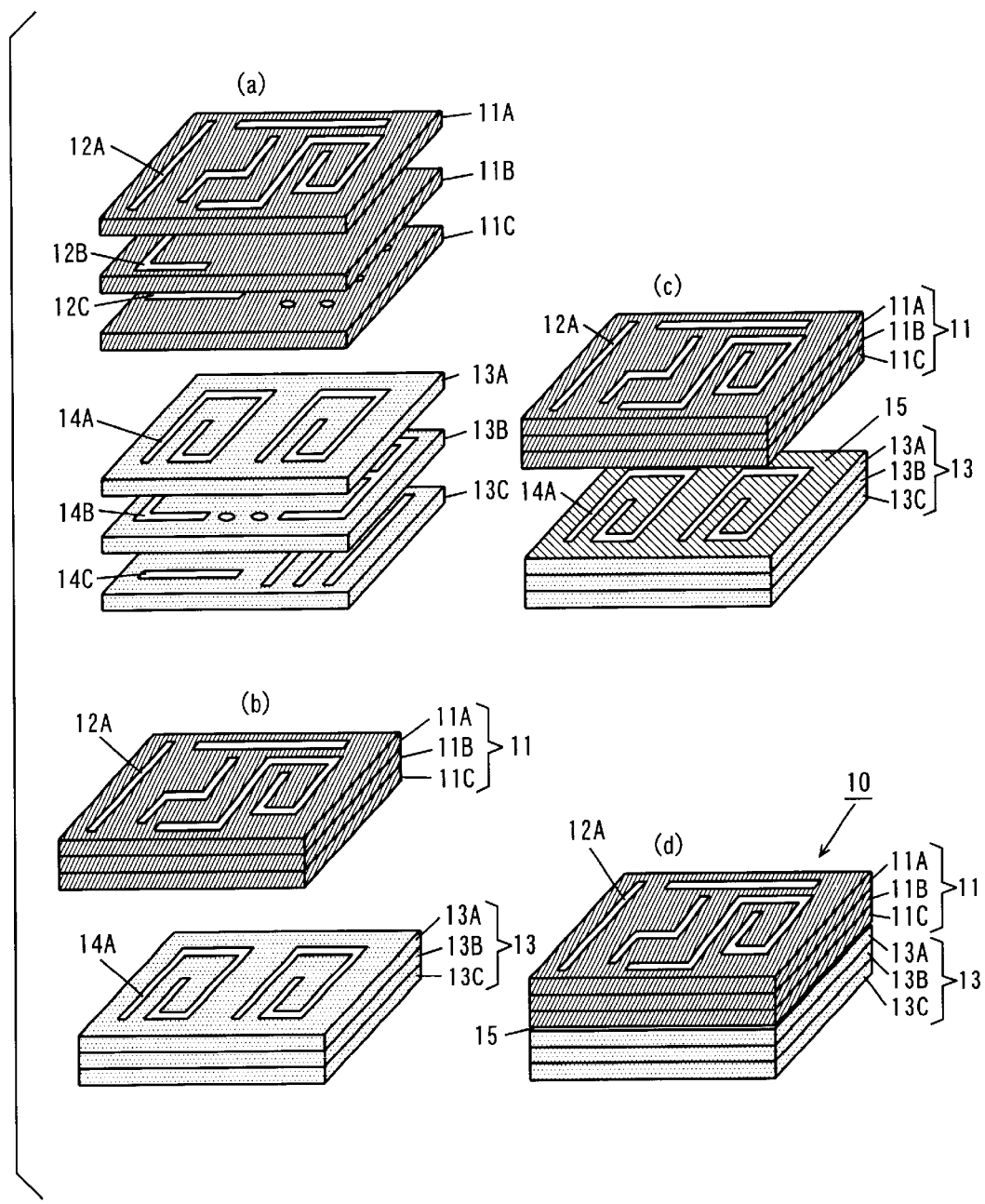
FIG. 2 is a schematic perspective view showing a method of manufacturing the composite multilayered ceramic board in the first embodiment of the present invention.

A description will now be made on a method of manufacturing the composite multilayered ceramic board 10 of FIG. 1. FIGS. 2(*a*), 2(*b*) and 2(*c*) are schematic perspective views showing a method of manufacturing a composite multilayered ceramic board in the first embodiment of the present invention.

With reference to FIG. 2(*a*), predetermined wiring patterns 12A to 12C are first formed, respectively, on green sheets 11A to 11C made of dielectric ceramics by screen printing. The green sheets 11A to 11C are composed of, e.g., barium titanate (a dielectric constatnt is 1400). Further, predetermined wiring patterns 14A to 14C are formed on green sheets 13A to 13C made of magnetic ceramics by screen printing. The green sheets 13A to 13C are composed of, e.g., NiZn ferrite (with an initial magnetic permeability>70, a magnetic flux density>0.2T).

Then, as shown in FIG. 2(b), the green sheets 11A to 11C are laminated and sintered in whole at a temperature of from 800° C. to 1600° C., so as to form the dielectric multilayered ceramic board 11. Further, the green sheets 13A to 13C are laminated and sintered in whole at a temperature of from 800° C. to 1600° C., so as to form the magnetic multilayered ceramic board 13.

Then, as shown in FIG. 2(c), an adhesive made of thermosetting resin such as polyimide and the like is applied to an upper face of the magnetic multilayered ceramic board 13, so as to form the adhesive layer 15. A detailed method of forming the adhesive layer 15 will be described later. While the adhesive is applied onto the upper face of the magnetic multilayered ceramic board 13, the adhesive maybe applied onto a lower face of the dielectric multilayered ceramic board 11.

Finally, as shown in FIG. 2(d), the dielectric multilayered ceramic board 11 and the magnetic multilayered ceramic board 13 are overlapped each other, then heated and pressurized at a temperature of approximately 200° C., so as to form the composite multilayered ceramic board 10.

FIG. 3 is a schematic cross-sectional view showing a detailed method of forming the adhesive layer 15 of the composite multilayered ceramic board 10 shown in FIG. 2.

With reference to FIG. 3(a), an adhesive 15a made of thermosetting resin such as photosensitive polyimide and the like is first applied onto the upper face of the magnetic multilayered ceramic board 13 on which the predetermined wiring pattern 14A is formed by screen printing. Then, as shown in FIG. 3(b), exposure is carried out by directing ultraviolet rays 38 to the adhesive 15a through a mask 39 having an opening 37 at a position opposing to the wiring pattern 14A.

Further, the adhesive 15a on the wiring pattern 14A is removed by developing the adhesive 15a, as shown in FIG. 3(c). The adhesive layer 15 is thus formed. Then, the dielectric multilayered ceramic board 11 is lapped over the magnetic multilayered ceramic board 13 through the adhesive layer 15, as shown in FIG. 3(d). Heating and pressurizing the overlapped boards at a temperature of from 180° C. to 200° C. provides the composite multilayered ceramic board 10, as shown in FIG. 3(e).

While the description is made on the method of forming the adhesive layer 15 for the magnetic multilayered ceramic board 13 in this embodiment, the formation of the adhesive layer 15 is not limited to the magnetic multilayered ceramic board 13. If the dielectric multilayered ceramic board 11 or the insulating multilayered ceramic board is used, the adhesive layer 15 may be formed at its joint face.

In the composite multilayered ceramic board 10, the wiring patterns 12A to 12C formed on the green sheets 11A to 11C made of dielectric ceramics constitute a circuit mainly including a capacitance component. Thus, the value of capacitance and the value of inductance can be obtained over a wide range. This makes it possible to reduce the number of capacitors or inductors being components for use in surface mount, enabling a decrease in the size of high frequency circuit components.

Since the dielectric multilayered ceramic board 11 and the magnetic multilayered ceramic board 13 are joined together by using the adhesive layer 15 that can be set at a temperature of not higher than 200° C., the deflection of the boards that is caused in sintering of different kinds of materials in whole can be suppressed, in the composite multilayered ceramic board 10 according to the first embodiment of the present invention. This inhibits deviations produced between the layers of the respective green sheets 11A to 11C, 13A to 13C and thereby prevents increased electrical resistance caused by wiring deviations. This makes it possible to improve circuit characteristics of the composite multilayered ceramic board 10.

Figure 11:
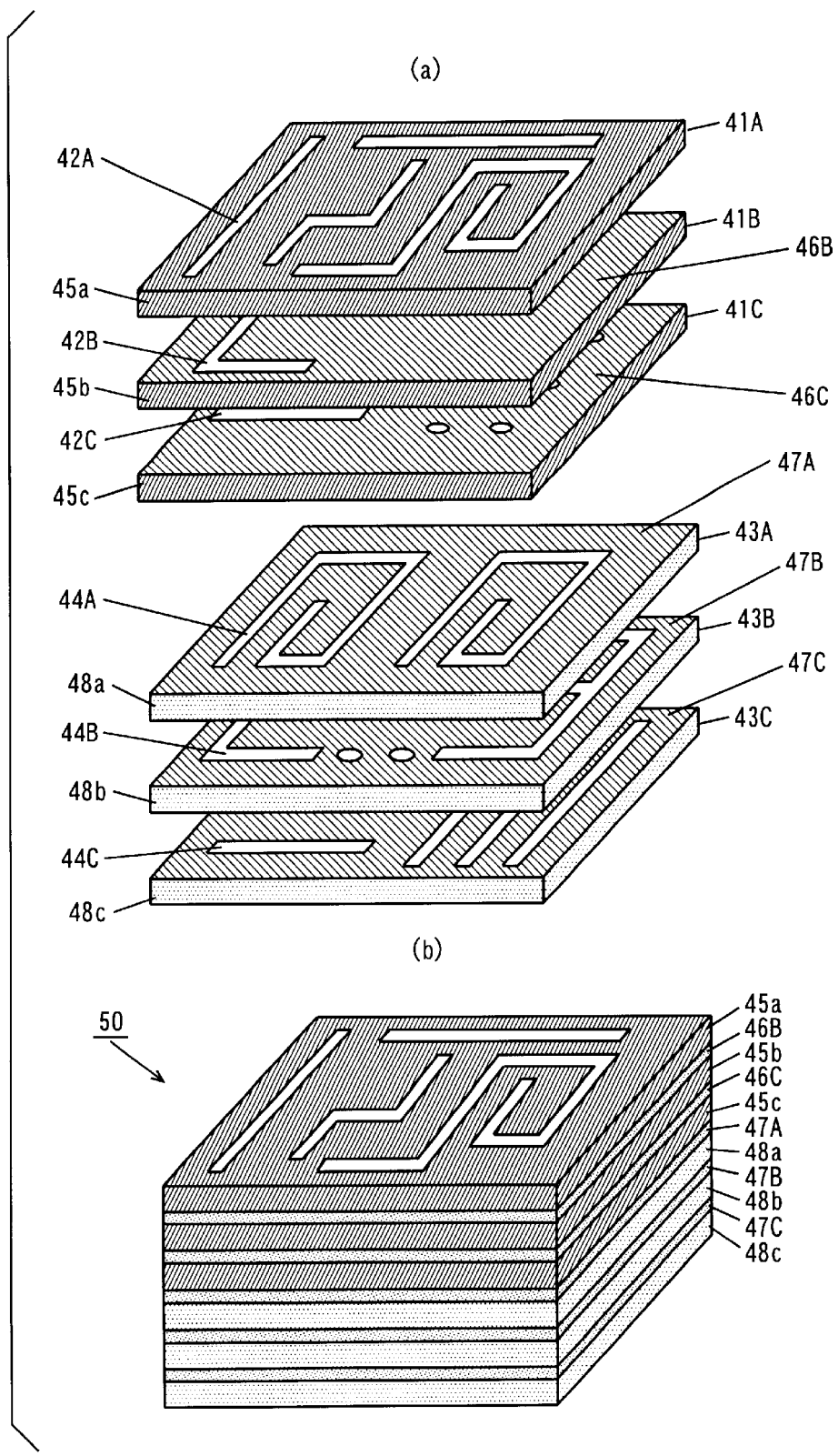
FIG. 11 is a schematic perspective view showing a manufacturing method of preventing the production of deviations in the wiring of the composite multilayered ceramic board.

In addition, since the green sheets 11A to 11C made of the same kind of materials and the green sheets 13A to 13C made of another same kind of materials are each joined by sintering at a high temperature that provides a high joint strength, the strength of the composite multilayered ceramic board 10 can be increased in comparison with such a method that the adhesive layer is interposed between the boards for each overlapping of the individual ceramic boards as shown in FIG. 11.

Moreover, since the composite multilayered ceramic board 10 is formed by forming the plurality of multilayered ceramic boards 11 and 13, respectively, at the same time, and after that, joining those multilayered ceramic boards 11 and 13 through the adhesive layer 15, the number of required steps for manufacture is decreased. Thus, the time and cost required for the manufacture of the composite multilayered ceramic board is reduced in comparison with the manufacturing step of joining the plurality of multilayered ceramic boards and the plurality of adhesive layers.

FIG. 4 is a schematic perspective view showing a composite multilayered ceramic board in a second embodiment of the present invention.

A composite multilayered ceramic board 20 includes a dielectric multilayered ceramic board 11, a magnetic multilayered ceramic board 13 and a prepreg board 27. Here, the prepreg board 27 includes a printed wiring board 17 with varnish layers 25, which is made of thermosetting resin such as polyimide and the like, provided on the opposite faces of the board 17. In the composite multilayered ceramic board 20, the dielectric multilayered ceramic board 11 and the magnetic multilayered ceramic board 13 are joined through the prepreg board 27 with the varnish layers 25 provided thereon.

While the description is made on the case where the composite multilayered ceramic board 20 includes the dielectric multilayered ceramic board 11 and the magnetic multilayered ceramic board 13 in the second embodiment of the present invention, the boards for use are not limited to the above described boards. An insulating multilayered ceramic board may substitute for the dielectric multilayered ceramic board 11 or the magnetic multilayered ceramic board 13. That is to say, the composite multilayered ceramic board 10 may include the dielectric multilayered ceramic board 11 and the insulating multilayered ceramic board. Alternatively, the composite multilayered ceramic board 10 may include the magnetic multilayered ceramic board 13 and the insulating multilayered ceramic board.

A description will now be made on a method of manufacturing the composite multilayered ceramic board 20 of FIG. 4. FIGS. 5(a), 5(b), 5(c) and 5(d) are schematic perspective views showing the method of manufacturing the composite multilayered ceramic board in the second embodiment of the present invention.

With reference to FIG. 5(a), predetermined wiring patterns 12A to 12C are first formed, respectively, on green sheets 11A to 11C made of dielectric ceramics by screen printing. The green sheets 11A to 11C are composed of, e.g., barium titanate (with a dielectric constant of 1400). Further, predetermined wiring patterns 14A to 14C are formed, respectively, on green sheets 13A to 13C made of magnetic ceramics by screen printing. The green sheets 13A to 13C are composed of, e.g., NiZn ferrite (an initial magnetic permeability>70, a magnetic flux density>0.2T).

Then, as shown in FIG. 5(b), the dielectric green sheets 11A to 11C are laminated and sintered in whole at a temperature of form 800° C. to 1600° C., thereby forming the dielectric multilayered ceramic board 11. Further, the green sheets 13A to 13C are laminated and sintered in whole at a temperature of from 800° C. to 1600° C., thereby forming the magnetic multilayered ceramic board 13. Moreover, predetermined wiring patterns 26 are formed on the opposite faces of the printed wiring board 17 by screen printing. The wiring patterns 26 are formed so that the predetermined wiring patterns of the dielectric multilayered ceramic board 11 and those of the magnetic multilayered ceramic board 13 are electrically connected to each other. Then, varnish layers 25 made of, e.g., thermosetting resin such as polyimide and the like are formed on the opposite faces of the printed wiring board 17, on which the wiring patterns 26 are formed, so as to form the prepreg board 27. A detailed method of forming the varnish layers 25 will be described later.

Finally, as shown in FIG. 5(c), the dielectric multilayered ceramic board 11 and the magnetic multilayered ceramic board 13 are overlapped each other through the prepreg board 27, then heated and pressurized at a temperature of approximately 200° C., thereby forming the composite multilayered ceramic board 20 shown in FIG. 4.

Figure 6:
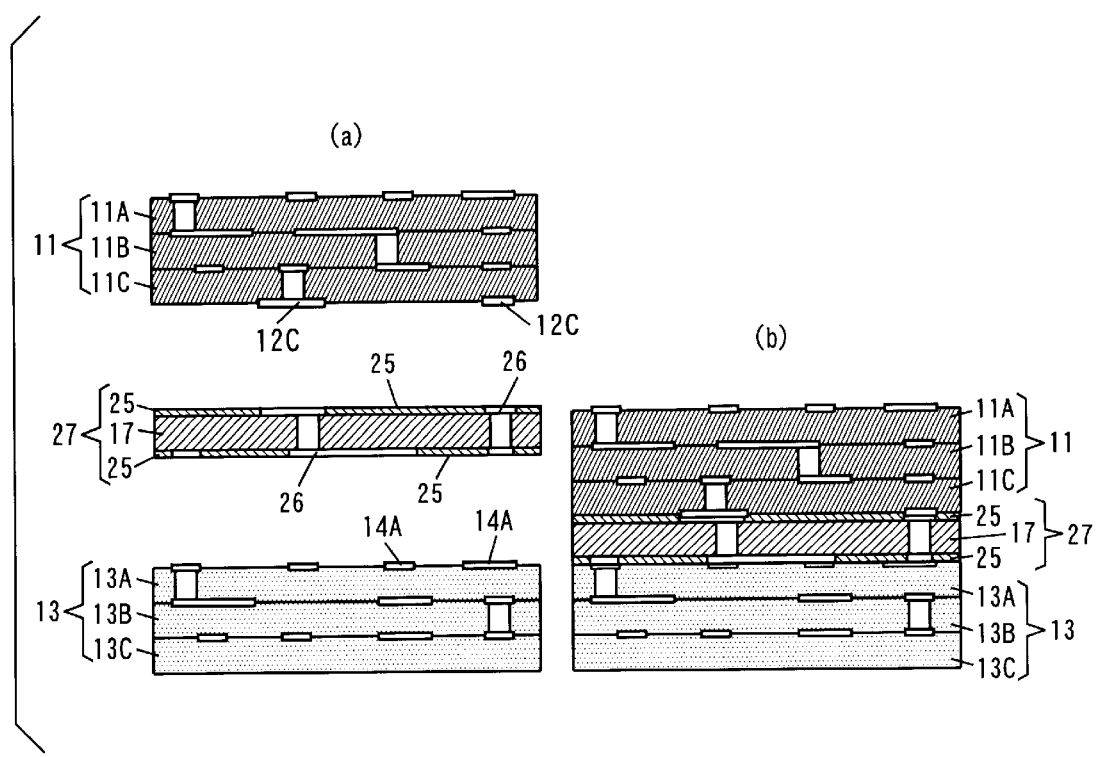
FIG. 6 is a schematic perspective view showing a detailed method of forming a prepreg board of the composite multilayered ceramic board shown in FIG. 5.
Figure 7:
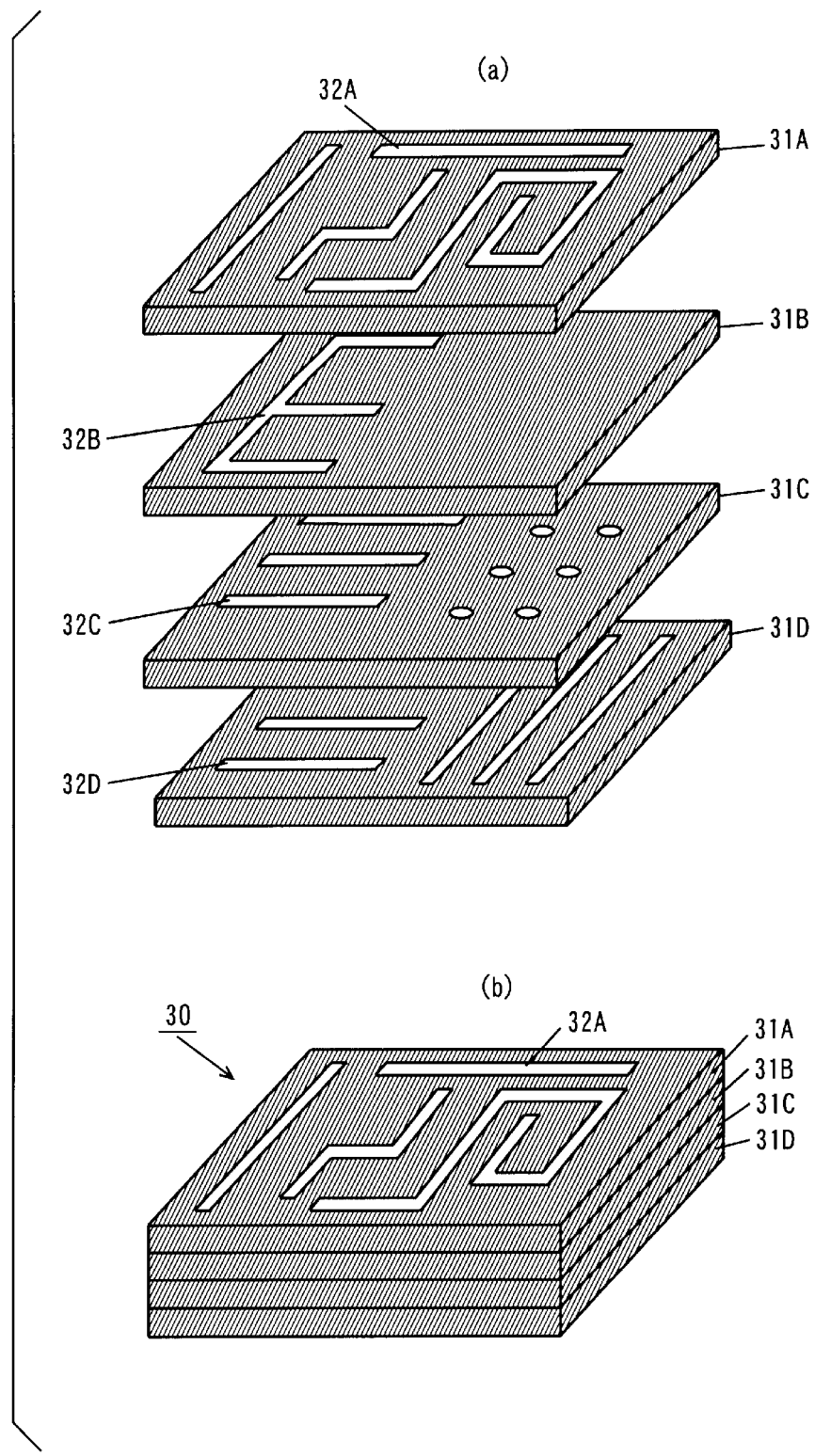
FIG. 7 is a schematic perspective view showing a method of manufacturing a conventional multilayered ceramic board.
Figure 8:
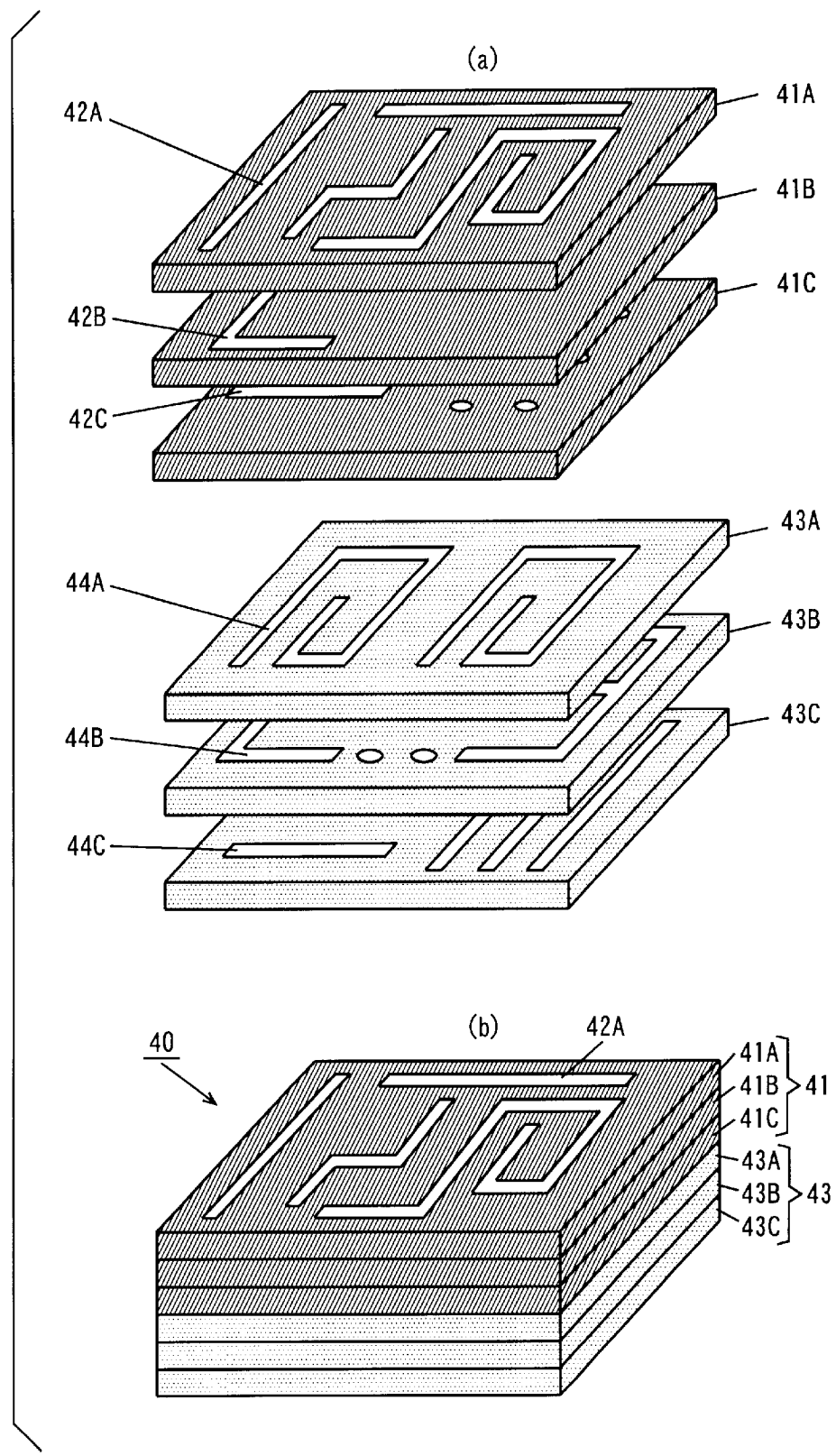
FIG. 8 is a schematic perspective view showing a manufacturing method of combining a dielectric multilayered ceramic board and a magnetic multilayered ceramic board.
Figure 9:
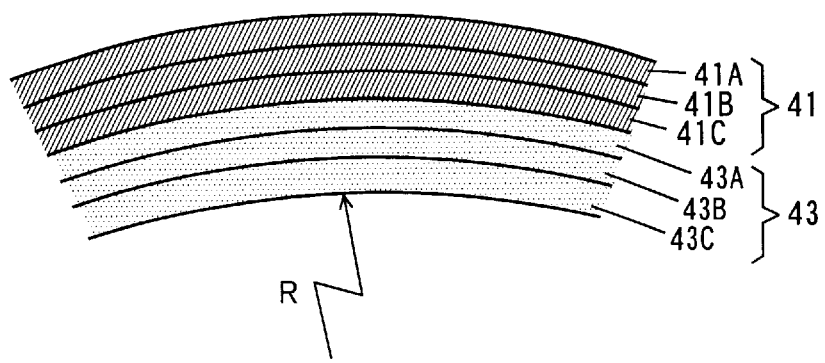
FIG. 9 is a schematic cross-sectional view showing a sintering state of a composite multilayered ceramic board having different shrinkage percentages.
Figure 10:
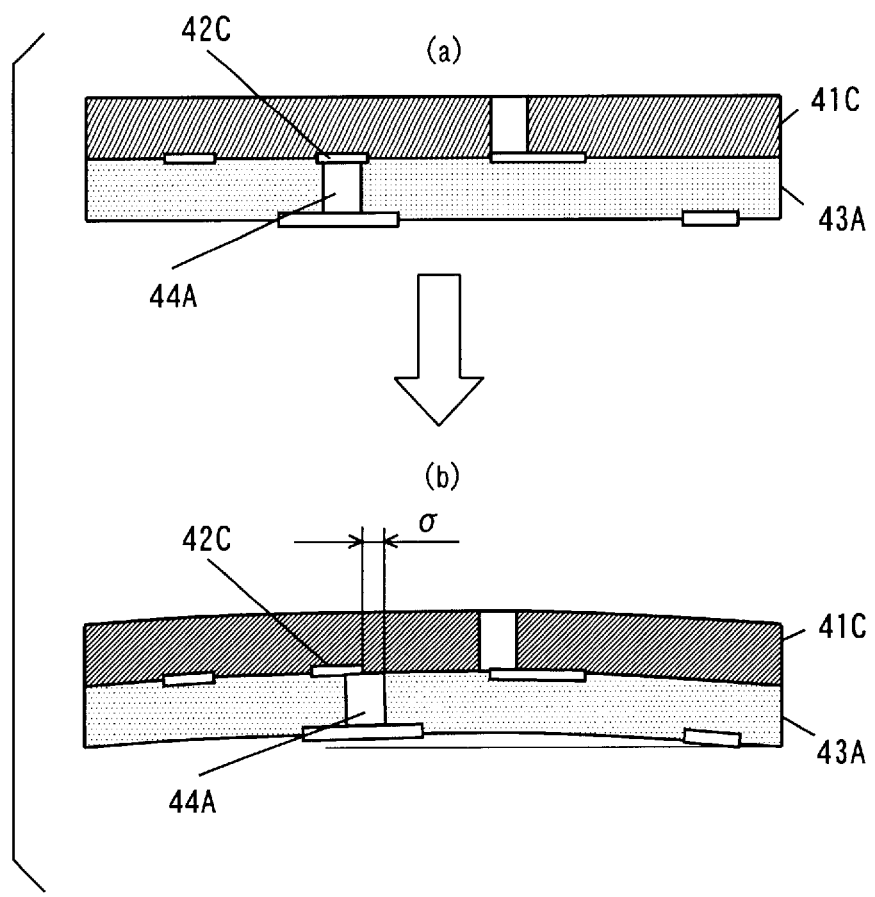
FIG. 10 is an enlarged view of a joint portion of the dielectric multilayered ceramic board and the magnetic multilayered ceramic board shown in FIG. 9.

FIG. 6 is a schematic cross-sectional view showing a detailed method of forming the prepreg board 27 of the composite multilayered ceramic board 20 shown in FIG. 5.

With reference to FIG. 6(a), the dielectric green sheets 11A to 11C, on which the predetermined wiring patterns 12A to 12C are formed by screen printing, are laminated and sintered, so as to form the dielectric multilayered ceramic board 11.

The wiring patterns 26 that electrically connect the wiring pattern 12C formed on the dielectric multilayered ceramic board 11C and the wiring pattern 14A formed on the magnetic multilayered ceramic board 13A are formed on the opposite faces of the printed wiring board 17 by screen printing. Then, varnish composed of thermosetting resin such as photosensitive polyimide is applied onto the opposite faces of the printed wiring board 17 where the predetermined wiring patterns 26 are formed. Like the method of forming the adhesive layer 15 shown in FIG. 3, exposure and development are carried out for the varnished board to remove the applied varnish on the wiring patterns 26 and thus form the varnish layer 25 on the opposite faces of the printed wiring board 17, thereby forming the prepreg board 27.

In addition, the magnetic green sheets 13A to 13C where the predetermined wiring patterns 14A to 14C are formed by screen printing are laminated and sintered, so as to form the dielectric multilayered ceramic board 13.

Then, as shown in FIG. 6(b), the dielectric multilayered ceramic board 11 and the magnetic multilayered ceramic board 13 are overlapped through the prepreg board 27 provided between those boards. The overlapped boards are then heated and pressurized at a temperature of from 180° C. to 200° C., so as to form the composite multilayered ceramic board 20.

In the composite multilayered ceramic board 20, the wiring patterns 12A to 12C formed on the green sheets 11A to 11C made of dielectric ceramics constitute a circuit mainly including a capacitance component. The wiring patterns 14A to 14C formed on the green sheets 13A to 13C made of magnetic ceramics constitute a circuit mainly including an inductance component. Thus, the value of capacitance and the value of inductance can be obtained over a wide range. This makes it possible to reduce the number of capacitors or inductors being components for use in surface mount and the size of high frequency circuit components.

In the composite multilayered ceramic board 20 according to the second embodiment of the present invention, since the dielectric multilayered ceramic board 11 and the magnetic multilayered ceramic board 13 are joined by using the varnish layer 25 formed on the prepreg board 27 that can be set at a temperature of 200° C., it becomes possible to inhibit the deflection of the boards that occurs during sintering of the different materials in whole. This suppresses the deviations caused between the layers of the respective green sheets 11A to 11C, 13A to 13C and prevents increased electrical resistance caused by wiring deviation. Consequently, the circuit characteristics of the composite multilayered ceramic board 20 can be improved.

Moreover, since the green sheets 11A to 11C made of the same kind of materials and the green sheets made of another same kind of materials 13A to 13C are each joined by high temperature sintering that provides high joint strength, the strength of the composite multilayered ceramic board 20 can be increased in comparison with the case where the adhesive layer is interposed for each overlapping of the individual ceramic boards as shown in FIG. 11.

Furthermore, the number of required steps for formation of the composite multilayered ceramic board 20 becomes decreased since the composite multilayered ceramic board 20 is formed by first forming the plurality of multilayered ceramic boards 11 and 13 at the same time, and after that, joining those boards 11 and 13 through the adhesive layer 15 formed on the prepreg board 27. Thus, the time and cost required for manufacturing the composite multilayered ceramic board 20 are reduced in comparison with the manufacturing step of joining a plurality of multilayered ceramic boards and a plurality of adhesive layers.

In the embodiments of the present invention, either the dielectric multilayered ceramic board 11 or the magnetic multilayered ceramic board 13 corresponds to the first multilayered ceramic board or the second multilayered ceramic board. The prepreg board corresponds to the wiring board.

While 3 layers are illustrated by way of example as the number of laminated layers of each multilayered ceramic board in the above described embodiments, the number of laminated layers is not limited to 3.

Moreover, while the material of the green sheets made of dielectric ceramics is barium titanate in the above described embodiments, the material is not limited to this, but other materials exhibiting dielectric properties such as titanium oxide, calcium titanate, strontium titanate and the like may be employed. While the material of the green sheets made of magnetic ceramics is NiZn ferrite, the material is not limited to this, but other materials exhibiting magnetism such as MnZn ferrite, NiCuZn ferrite, Barium-system hexagonal crystal ferrite and the like may be employed. In addition, alumina, silicon dioxide and the like can be employed as the material of the green sheets made of insulating ceramics.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A composite multilayered ceramic board comprising:

a first multilayered ceramic board formed by integrally sintering a plurality of green sheets that have a predetermined wiring pattern and are made of a first material;

a second multilayered ceramic board formed by integrally sintering a plurality of green sheets that have a predetermined wiring pattern and are made of a second material different from said first material;

an adhesive layer formed between said first multilayered ceramic board and said second multilayered ceramic board; and a wiring board, wherein said adhesive layer includes a first adhesive layer and a second adhesive layer, said wiring board being interposed between said first adhesive layer and said second adhesive layer, one face of said first multilayered ceramic board is joined to one face of said first adhesive layer, one face of said wiring board is joined to the other face of said first adhesive layer, one face of said second multilayered ceramic board is joined to one face of said second adhesive layer, and the other face of said wiring board is joined to the other face of said second adhesive layer.

2. The composite multilayered ceramic board according to claim 1, wherein a partial region of said adhesive layer is removed for the electrical connection between the wiring pattern of said first multilayered ceramic board and the wiring pattern of said second multilayered ceramic board.

3. The composite multilayered ceramic board according to claim 1, wherein said first material includes one of a dielectric material, a magnetic material and an insulating material, and said second material includes one of a dielectric material, a magnetic material and an insulating material.

4. The composite multilayered ceramic board according to claim 1, wherein said first material is the dielectric material, and said second material is the magnetic material.

5. The composite multilayered ceramic board according to claim 1, wherein said first material is the dielectric material, and said second material is the insulating material.

6. The composite multilayered ceramic board according to claim 1, wherein said first material is the magnetic material, and said second material is the insulating material.

7. A composite multilayered ceramic board comprising:

a first multilayered ceramic board formed by integrally sintering a plurality of green sheets that have a predetermined wiring pattern and are made of a first material;

a second multilayered ceramic board formed by integrally sintering a plurality of green sheets that have a predetermined wiring pattern and are made of a second material different from said first material;

an adhesive layer formed between said first multilayered ceramic board and said second multilayered ceramic board, wherein said adhesive layer includes thermosetting resin.

* * * * *